US012795906B2

(12) United States Patent
Chen et al.

(10) Patent No.: US 12,795,906 B2
(45) Date of Patent: Nov. 10, 2026

(54) COMPACT EFUSE STRUCTURE

(71) Applicant: Taiwan Semiconductor Manufacturing Company, Ltd., Hsinchu (TW)

(72) Inventors: Jui-Lin Chen, Taipei (TW); Meng-Sheng Chang, Hsinchu County (TW); Ping-Wei Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 444 days.

(21) Appl. No.: 18/488,805

(22) Filed: Oct. 17, 2023

(65) Prior Publication Data

US 2025/0048624 A1 Feb. 6, 2025

Related U.S. Application Data

(60) Provisional application No. 63/517,146, filed on Aug. 2, 2023.

(51) Int. Cl.
*H10B 20/25* (2023.01)
*H10W 20/49* (2026.01)

(52) U.S. Cl.
CPC .......... *H10B 20/25* (2023.02); *H10W 20/493* (2026.01)

(58) Field of Classification Search
CPC ............................. H10B 20/25; H10W 20/493
See application file for complete search history.

(56) References Cited

U.S. PATENT DOCUMENTS 10,163,783 B1 12/2018 Chang
11,373,719 B1 * 6/2022 Behera .................. G11C 17/10
11,665,878 B2 * 5/2023 Chanemougame .. H10B 10/125 257/369
2009/0244972 A1 10/2009 Ogura
2012/0120703 A1 * 5/2012 Chang .................. G11C 11/412 365/51
2016/0276019 A9 * 9/2016 Lin ....................... G11C 11/419
2020/0058361 A1 * 2/2020 Chang .................... G11C 17/16
2022/0415378 A1 * 12/2022 Banerjee .............. G06F 30/392
2023/0011223 A1 1/2023 Wang
2023/0088425 A1 3/2023 Gebreselasie
2024/0370622 A1 * 11/2024 Chang .................. G06F 30/392

FOREIGN PATENT DOCUMENTS

EP 2332145 B1 * 8/2019 ............ H10N 50/10
TW 200945557 A 11/2009
TW 201535663 A 9/2015
WO WO-2022072068 A1 * 4/2022 .......... H10D 84/853

* cited by examiner

*Primary Examiner* — Mamadou L Diallo
(74) *Attorney, Agent, or Firm* — HAYNES AND BOONE, LLP

(57) ABSTRACT

The present disclosure provides embodiments of electronic fuse devices. An electronic fuse device according to the present disclosure includes a first bit cell comprising a first plurality of active regions extending along a first direction and a second bit cell comprising a second plurality of active regions extending along the first direction. Each of the first plurality of active regions is aligned with one of the second plurality of active regions along the first direction. The first bit cell and the second bit cell are spaced apart along the first direction by a space and the space is free of a well tap cell.

20 Claims, 17 Drawing Sheets

COMPACT EFUSE STRUCTURE

PRIORITY DATA

This application claims priority to U.S. Provisional Patent Application Ser. No. 63/517,146, filed Aug. 2, 2023, the entirety of which is incorporated herein by reference.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As integrated circuit devices are scaling down, so are the electrostatic discharge (ESD) prevention devices. ESD prevention devices that are designed and fabricated based on existing rule constraints may not function properly in a different technology generation. Therefore, while existing ESD prevent devices are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
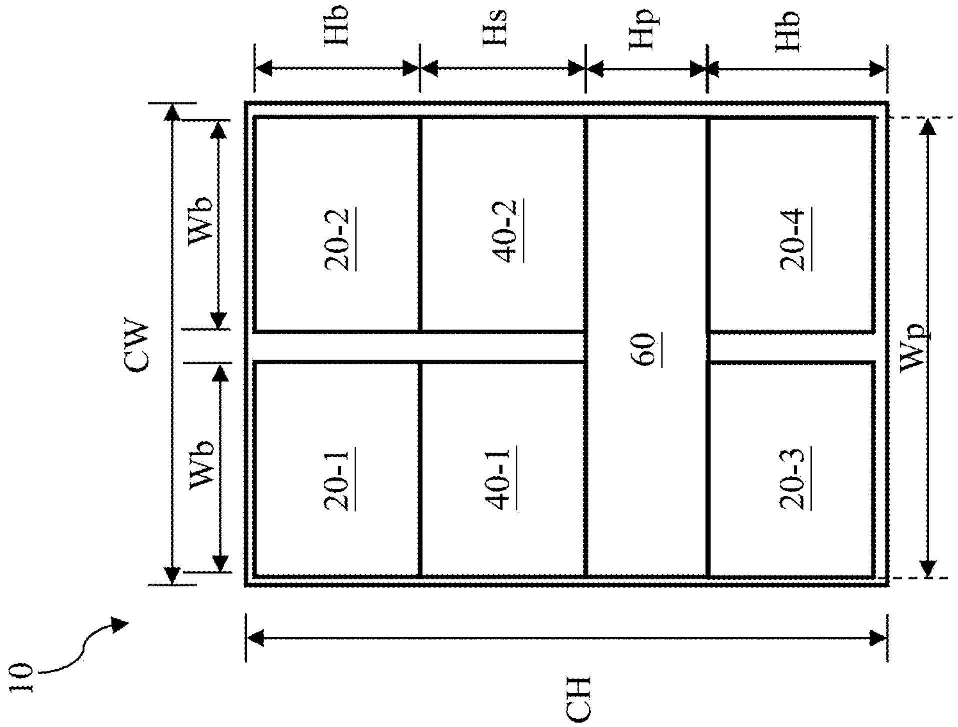
FIG. 1 is a schematic top view of an electronic fuse (eFuse) cell according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Throughout the disclosure, like reference numerals denote like features and may indicate similar compositions or formation processes unless otherwise described. For that reason, features with the same reference numerals may only be described once for simplicity.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Electronic fuses, otherwise known as Efuses, electrical fuses or electrically programmable fuses, may be used to enable or implement memory redundancy, chip identification, chip authentication, programmable memory, programmable IC chips, or circuit protection. For example, an Efuse may be used to enable chip performance tuning after the chip is made. In a scenario where a sub-system fails, an Efuse cell may blow a fuse link to switch to a back-up subsystem. An Efuse cell includes arrays of n-type transistors and p-type transistors to form complementary metal oxide semiconductor (CMOS) devices. In some examples, n-type transistors are formed over a p-type well and p-type transistors are formed over an n-type well. To prevent latch-up that leads to short circuit between a positive supply voltage (VDD) and a circuit ground (VSS), tap cells (or well tap cells) may be inserted between Efuse bit cells. Tap cells connect the n-type well to a positive supply voltage (VDD) and the p-type well to circuit ground (VSS). Because the tap cells do not have logical functions other than to prevent short circuits, they are sometimes referred to as physical-only cells because they are needed to resolve the latch-up issue in physical circuits. Because Efuse cells may see voltage higher than operating voltage of logic circuit, Efuse cells may include more tap cells or well-to-well spacing to ensure reliability and performance. While the tap cells and greater well-to-well spacing work well in reducing latch-up, their implementation into the physical circuit necessitates a larger Efuse cell and make it more challenging to reduce the dimensions of an Efuse cell.

The present disclosure provides embodiments of Efuse cells that are free of tap cells. In some embodiments, each of the transistors in an Efuse cell is a gate-all-around (GAA) transistor that includes a gate structure that wraps completely around each of a vertical stack of nanostructures. Due to the shapes of the nanostructures, each of the transistors may also be referred to as a nanosheet transistor. Each of the Efuse cells includes a complementary metal oxide semiconductor (CMOS) design that includes n-type GAA transistors and p-type GAA transistors. The n-type GAA transistors are formed over a p-type well on a substrate and the p-type GAA transistors are formed over an n-type well of the substrate. According to the present disclosure, the substrate, including a portion of the n-type well and the p-type well, is thinned such that n-type well and the p-type well are shallow enough to be isolated by isolation features, such as shallow trench isolation (STI) features. Because the n-type well and the p-type well are isolated from one another, the potential latch-up problem is eliminated. According to the present disclosure, tap cell are no longer needed in an Efuse cell. In at least some embodiments, a space between two adjacent bit cells may be free of any tap cells. In some embodiments, while tap cells are not needed, dummy tap cells or dummy active regions may still be needed to provide more areas for routing needs, especially for the metal layer where fuse links are present.

FIG. 1 provides a schematic top view of an electronic fuse (eFuse) cell 10. According to some aspects of the present disclosure, the eFuse cell 10 includes a first bit cell 20-1, a second bit cell 20-2, a third bit cell 20-3, a fourth bit cell 20-4, a first sense amplifier cell 40-1, a second sense amplifier cell 40-2, and a power switch 60. Each of the first bit cell 20-1, the second bit cell 20-2, the third bit cell 20-3, and the fourth bit cell 20-4 includes an array of transistors serving as, for example, selection transistors or bit line selection transistors. Each of the first sense amplifier cell 40-1 and the second sense amplifier cell 40-2 is configured to compare a bit cell current of the first bit cell 20-1, the second bit cell 20-2, the third bit cell 20-3, and the fourth bit cell 20-4 and a reference voltage to read a programming status of the first bit cell 20-1, the second bit cell 20-2, the third bit cell 20-3, and the fourth bit cell 20-4. The power switch 60 is configured to provide a positive supply voltage (VDD) or a circuit ground (VSS).

As illustrated in FIG. 1, the eFuse cell 10 and all of the sub-cells disposed therein may include a rectangular shape. The eFuse cell 10 includes a cell height (CH) and a cell width (CW). The first bit cell 20-1, the second bit cell 20-2, the third bit cell 20-3, and the fourth bit cell 20-4 may have the same dimensions. In some instances, each of the first bit cell 20-1, the second bit cell 20-2, the third bit cell 20-3, and the fourth bit cell 20-4 may have a bit cell height (Hb) and a bit cell width (Wb). The first sense amplifier cell 40-1 and the second sense amplifier cell 40-2 may have the same dimensions. In some instances, each of the first sense amplifier cell 40-1 and the second sense amplifier cell 40-2 may have a sense amplifier height (Hs) and a sense amplifier width (Ws). The power switch 60 includes a power switch height (Hp) and a power switch width (Wp). As shown in FIG. 1, the cell height (CH) includes two bit cell heights (Hb), the sense amplifier height (Hs), and the power switch height (Hp). Similarly, the cell width (CW) accounts for two bit cell widths (Wb) or the power switch width (Wp). It can be seen that the dimensions of the first bit cell 20-1, the second bit cell 20-2, the third bit cell 20-3, the fourth bit cell 20-4, the first sense amplifier cell 40-1, the second sense amplifier cell 40-2, and the power switch 60 determine the dimensions of the Efuse cell 10. The key to reduce dimensions of the Efuse cell 10 is to reduce dimensions of some or all of the sub-cells in it.

Figure 2:
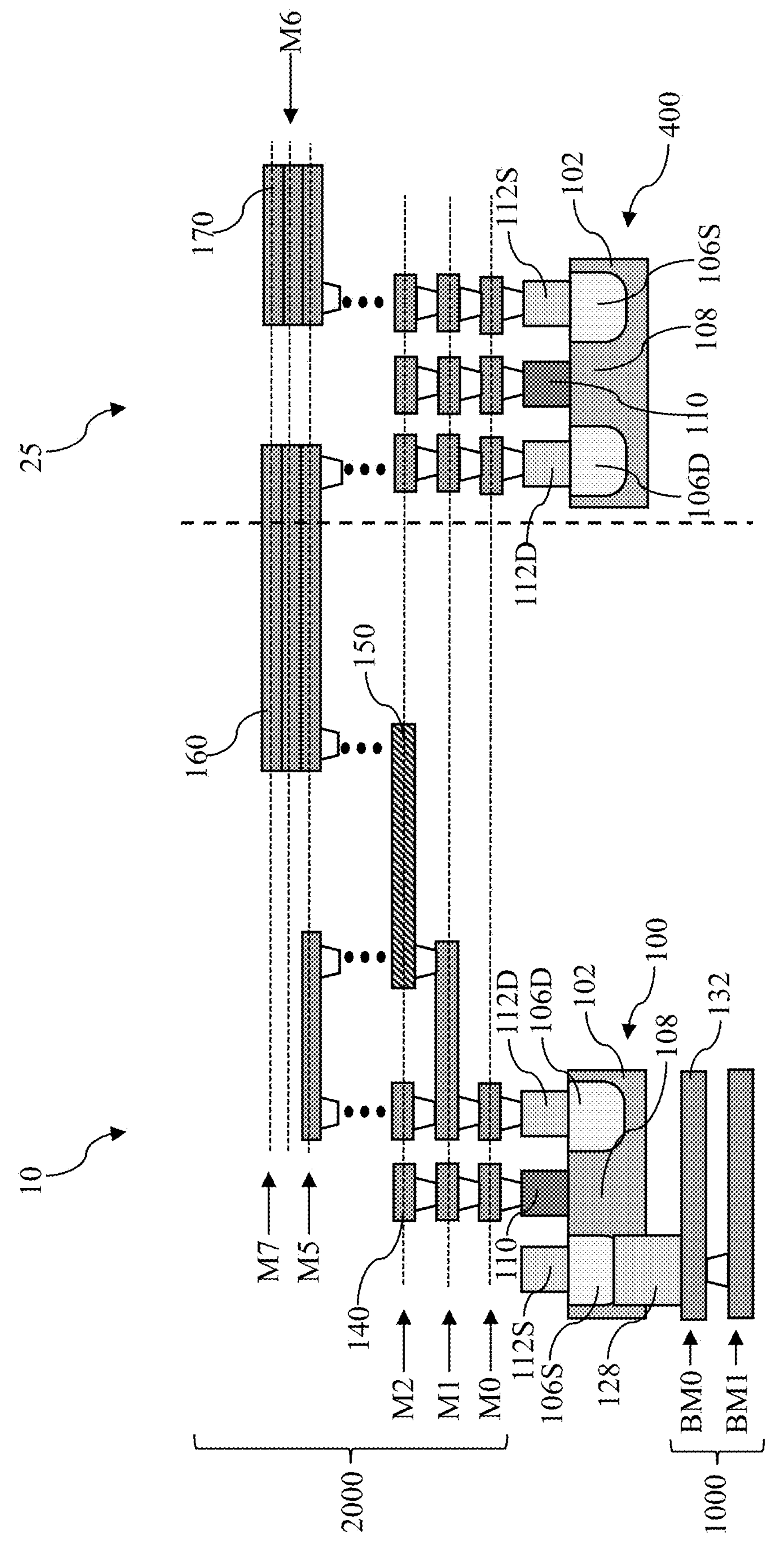
FIG. 2 illustrates a schematic cross-sectional view of electrical connection among a selection transistor, a fuse link, and a program transistor, according to various aspects of the present disclosure.

FIG. 2 illustrates a schematic cross-sectional view of electrical connection among a selection transistor 100, a fuse link 150, and a program transistor 400 in a peripheral circuit 25. The selection transistor 100 may be a transistor in one of the first bit cell 20-1, the second bit cell 20-2, the third bit cell 20-3, and the fourth bit cell 20-4. The selection transistor 100 and the fuse link 150 are in the Efuse cell 10 while the peripheral circuit 25 is external to the Efuse cell 10, not explicitly illustrated in FIG. 1. Referring to FIG. 2, the selection transistor 100 and the program transistor 400 are fabricated on a substrate 102. Each of the selection transistor 100 and the program transistor 400 includes an active region 108 disposed between a source feature 106S and a drain feature 106D, and a gate structure 110 disposed over the active region 108. Each of the selection transistor 100 and the program transistor 400 also includes a source contact 112S electrically coupled to the source feature 106S and a drain contact 112D electrically coupled to the drain feature 106D. The selection transistor 100 and the program transistor 400 may be interconnected by a backside interconnect structure 1000 below the substrate 102 and a frontside interconnect structure 2000 over a front surface of the substrate 102. For illustration purposes and not to limit the scope of the present disclosure, the backside interconnect structure 1000 includes a first backside metal layer BM0 and a second backside metal layer BM1 and the frontside interconnect structure 2000 includes a first frontside metal layer M0, a second frontside metal layer M1, a third frontside metal layer M2, a fourth frontside metal layer M3, a fifth frontside metal layer M4, a sixth frontside metal layer M5, a seventh frontside metal layer M6, and an eighth frontside metal layer M7.

Reference is still made to FIG. 2. In some embodiments, the source feature 106S of the selection transistor 100 is electrically coupled to a backside power rail 132 in the first backside metal layer BM0 by way of a backside contact via 128. In some instances, the backside power rail 132 is electrically coupled to a circuit ground (VSS). Through metal lines and contact vias, a word line 140 is electrically coupled to the gate structure 110 of the selection transistor 100. A fuse link 150 is disposed in the third frontside metal layer M2. In some instances, the fuse link 150 includes copper (Cu). As will be described further below, a portion of the fuse link 150 is configured to blow open when a current flowing through is too great. Through metal lines and contact vias in different frontside metal layers, the fuse link 150 is electrically coupled between the drain feature 106D of the selection transistor 100 and a bit line 160, which is disposed in the sixth frontside metal layer M5, the seventh frontside metal layer M6, and the eighth frontside metal layer M7. Through metal lines and contact vias in various frontside metal layers, the bit line 160 is electrically coupled to the drain feature 106D of the program transistor 400. The source feature 106S of the program transistor 400 is electrically coupled to a frontside power rail 170 by way of metal layers and contact vias in various frontside metal layers. The frontside power rail 170 may be electrically coupled to a positive supply voltage (VDD) As will be described further below, the selection transistor 100 may be n-type transistor or p-type transistor having structures illustrated in FIGS. 3, 4, and 5. Due to the formation of the backside contact via 128 and the backside power rail 132, the substrate 102 is thinned down such that the active regions 108 are no longer commonly coupled to a bulk semiconductor substrate.

Figure 3:
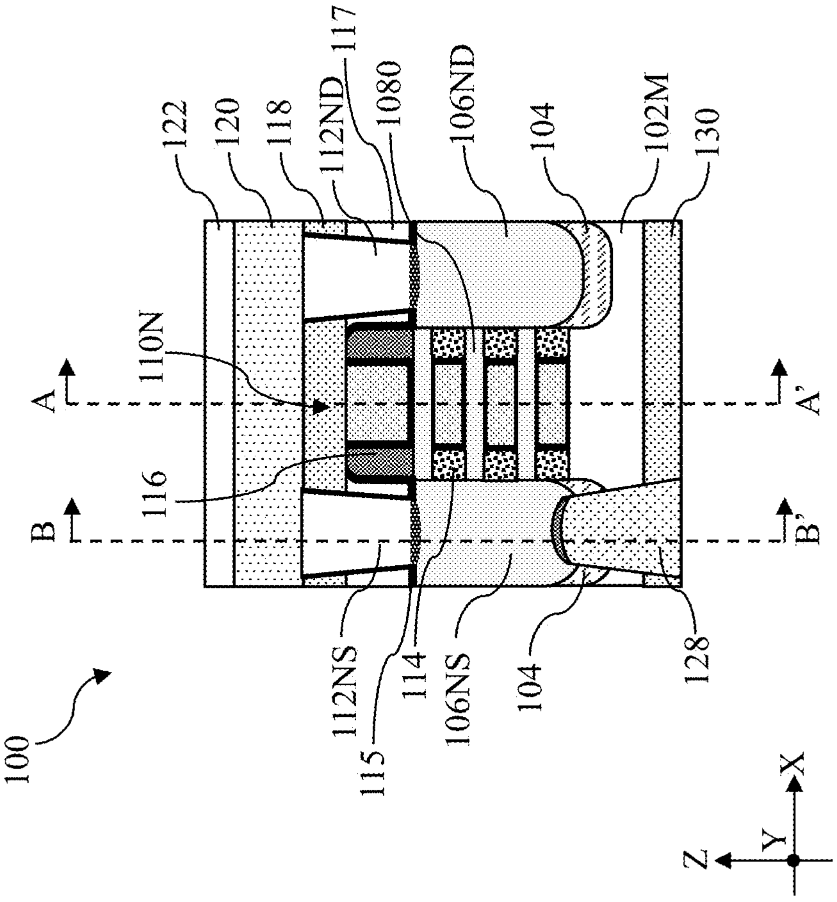
FIG. 3 illustrates a cross-sectional view of a transistor in an eFuse bit cell, according to various aspects of the present disclosure.

FIG. 3 illustrates a cross-sectional view of a transistor 100 in one of the first bit cell 20-1, the second bit cell 20-2, the third bit cell 20-3, and the fourth bit cell 20-4. The transistor 100 in FIG. 3 may be implemented as the selection transistor 100 in FIG. 2 and for that reason, the same reference numeral 100 is used for both the transistor 100 in FIG. 3 and the selection transistor 100 in FIG. 2. The transistor 100 in FIG. 3 may be an n-type transistor portion in a CMOS device that also includes a p-type transistor. Referring to FIG. 3, the transistor 100 includes a plurality of channel members 1080 stacked one over another over a mesa feature 102M. The channel members 1080 and the mesa feature 102M are patterned from a substrate, (such as the substrate 102) and may be collectively referred to as the active region 108. The channel members 1080 are sandwiched between an n-type source feature 106NS and an n-type drain feature 106ND along the X direction. An n-type gate structure 110N wraps around each of the plurality of channel members 1080. Along the Z direction, the plurality of channel members 1080 are interleaved by a plurality of inner spacer features 114 at each end to space the n-type gate structure 110N apart from the n-type source feature 106NS and the n-type drain feature 106ND. Each of the n-type source feature 106NS and the n-type drain feature 106ND is spaced apart from the mesa feature 102M by an undoped epitaxial layer 104. Over the plurality of channel members 1080, sidewalls of the n-type gate structure 110N are covered by a gate spacer 116. A contact etch stop layer (CESL) 115 is disposed over top surfaces of the n-type source feature 106NS and the n-type drain feature 106ND. A first interlayer dielectric (ILD) layer 117 is disposed over the CESL 115. A self-aligned capping (SAC) layer 118 is disposed over the n-type gate structure 110N. An etch stop layer (ESL) 120 is disposed over the SAC layer 118 and a second ILD layer 122 is disposed over the ESL 120. An n-type source contact 112NS is disposed over and electrically coupled to the n-type source feature 106NS. An n-type drain contact 112ND is disposed over and electrically coupled to the n-type drain feature 106ND. The n-type source contact 112NS and the n-type drain contact 112ND extend through the first ILD layer 117 and the SAC layer 118. A backside contact via 128 extends through a backside dielectric layer 130, the mesa feature 102M, and the undoped epitaxial layer 104 to electrically couple to the n-type source feature 106NS.

The plurality of channel members 1080 and the mesa feature 102M may share the same composition as they are patterned from the substrate. In one embodiment, the substrate may include silicon (Si). In some other embodiments, the substrate may include germanium (Ge), silicon carbide (SiC), silicon germanium (SiGe), III-V semiconductors, or diamond. Further, the substrate may optionally include one or more epitaxial layers. The undoped epitaxial layer 104 may include undoped silicon (Si), undoped silicon germanium (SiGe), or undoped germanium (Ge). In one embodiment, the undoped epitaxial layer 104 may include silicon germanium (SiGe). The n-type source feature 106NS and the n-type drain feature 106ND may include silicon and an n-type dopant, such as phosphorus (P) or arsenic (As). The inner spacer features 114 and the gate spacer 116 include silicon oxide, silicon nitride, silicon oxycarbonitride, or silicon oxycarbide. The CESL 115 and the ESL 120 may include silicon nitride or silicon oxynitride. The first ILD layer 117 and the second ILD layer 122 may include silicon oxide, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The SAC layer 118 may include silicon nitride. The backside contact via 128, the n-type source contact 112NS, and the n-type drain contact 112ND may include copper (Cu), cobalt (Co), or nickel (Ni). A metal silicide, such as titanium silicide, cobalt silicide, or nickel silicide, may be present between the backside contact via 128 and the n-type source feature 106NS, the n-type source contact 112NS and the n-type source feature 106NS, as well as between the n-type drain contact 112ND and the n-type drain feature 106ND.

While not explicitly illustrated in FIG. 3, the n-type gate structure 110N includes a gate dielectric layer and a gate electrode layer. In some embodiments, the gate dielectric layer may include an interfacial layer and a high-k dielectric layer. Here, high-k dielectric materials, as used and described herein, include dielectric materials having a high dielectric constant, for example, greater than that of thermal silicon oxide (~3.9). The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The high-k dielectric layer may include hafnium oxide. Alternatively, the high-k dielectric layer may include other high-k dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The high-K gate dielectric layer may be formed by ALD, physical vapor deposition (PVD), CVD, oxidation, and/or other suitable methods.

The gate electrode layer of the gate structures may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a CMP process may be performed to remove excessive metal, thereby providing a substantially planar top surface of the gate structures.

Figure 4:
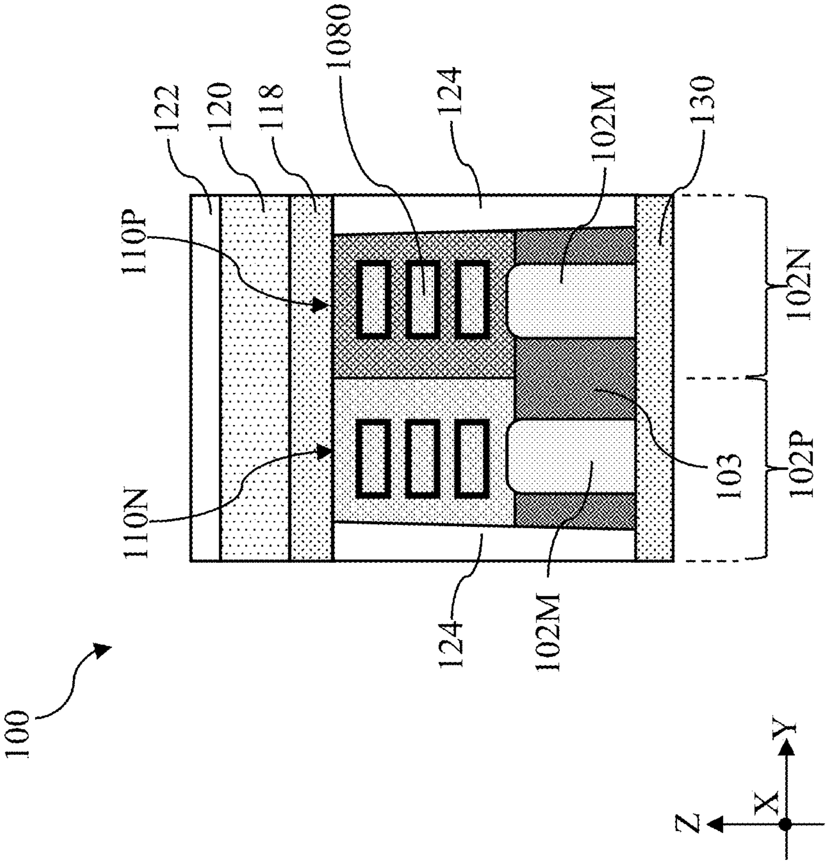
FIG. 4 illustrates a cross-sectional view of channel regions of a transistor in an eFuse bit cell, according to various aspects of the present disclosure.

FIG. 4 illustrates a cross-sectional view of the transistor 100 in FIG. 3 along line A-A', which cuts through the n-type gate structure 110N. As described above, the n-type transistor shown in FIG. 3 may be a part of a CMOS device that also includes a p-type transistor. In FIG. 4, the n-type gate structure 110N directly abuts a p-type gate structure 110P. The p-type gate structure 110P wraps around each of another plurality of channel members 1080. As shown in FIG. 4, the n-type gate structure 110N directly contacts and is electrically coupled to the p-type gate structure 110P. The plurality of channel members 1080 is also disposed over another mesa feature 102M. The mesa features 102M under the n-type gate structure 110N and the p-type gate structure 110P are surrounded by and spaced apart from one another by an isolation structure 103. In some embodiments, the isolation structure 103 may include a shallow trench isolation (STI) structure. The plurality of channel members 1080 extend lengthwise along the X direction and the n-type gate structure 110N and the p-type gate structure 110P extending lengthwise along the Y direction. Along the Y direction, the n-type gate structure 110N and the p-type gate structure 110P are sandwiched between two dielectric fins 124 that extend into the isolation structure 103. Top surfaces of the n-type gate structure 110N, the p-type gate structure 110P, and the two dielectric fins 124 are coplanar. Along the lengths of the n-type gate structure 110N and the p-type gate structure 110P, a portion of the SAC layer 118 spans over top surfaces of the n-type gate structure 110N, the p-type gate structure 110P, and the two dielectric fins 124. The ESL 120 is disposed over the SAC layer 118 and the second ILD layer 122 is disposed over the ESL 120. The two dielectric fins 124 may include silicon nitride or silicon oxycarbonitride.

Reference is still made to FIG. 4. The n-type gate structure 110N and the channel members 1080 it wraps around are disposed over a p-type well region 102P on the substrate. The structure in FIG. 4 is formed after a substantial portion of the substrate is removed by grinding and polishing. The mesa feature 102M over the p-type well 102P may include a p-type dopant, such as boron (B). Similarly, the mesa feature 102M over the n-type well 102N may include an n-type dopant, such as phosphorus (P). The grinding down of the substrate, as shown in FIG. 4, causes the isolation structure 103 to completely isolate the mesa feature 102M over the p-type well 102P from the mesa feature 102M over the n-type well 102N. It can also be seen that no semiconductor structure physically contacts both mesa features 102M in FIG. 4.

Figure 5:
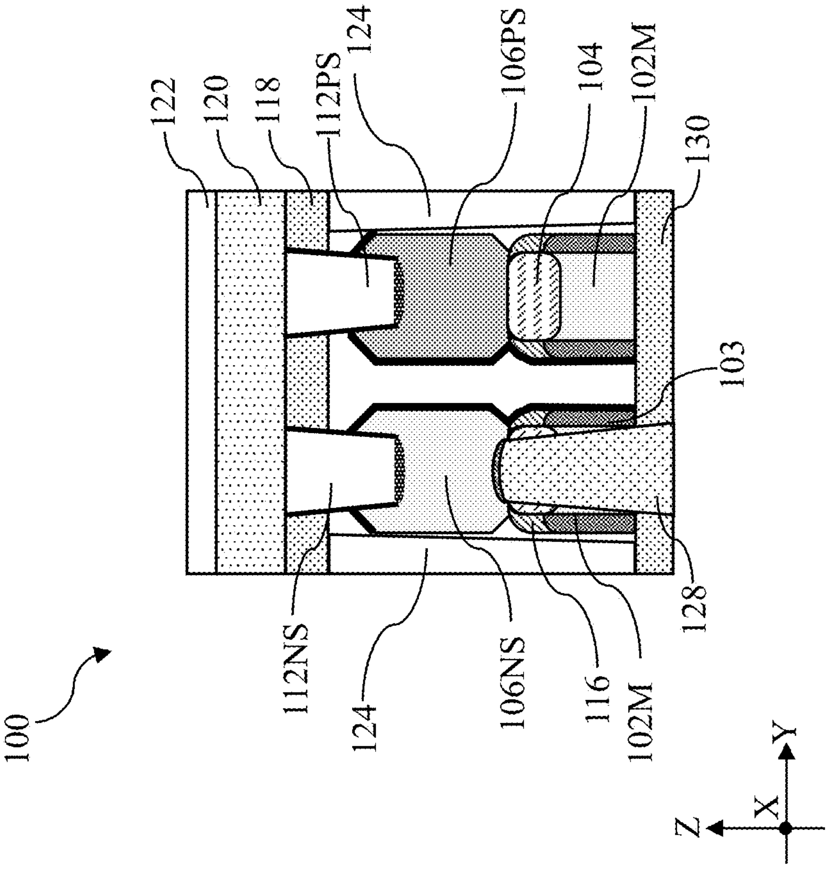
FIG. 5 illustrates a cross-sectional view of source/drain regions of a transistor in an eFuse bit cell, according to various aspects of the present disclosure.

FIG. 5 illustrates a cross-sectional view of the transistor 100 in FIG. 3 along line B-B', which cuts through the n-type source feature 106NS. Like the channel members 1080 for the n-type transistor extending between the n-type source feature 106NS and the n-type drain feature 106ND, the channel members 1080 for the p-type transistor extends between a p-type source feature 100PS and a p-type drain feature 100PD (not explicitly shown in FIG. 5) along the X direction. The p-type source feature 100PS and the p-type drain feature 100PD may include silicon germanium (SiGe) and a p-type dopant, such as boron (B). FIG. 5 also illustrates the n-type source contact 112NS disposed over and coupled to the n-type source feature 106NS and a p-type source contact 112PS disposed over and coupled to the p-type source feature 106PS. Each of the n-type source feature 106NS and the p-type source feature 106PS is disposed on the undoped epitaxial layer 104, which is disposed over a mesa feature 102M. The mesa features 102M and the two dielectric fins 124 are disposed on the backside dielectric layer 130. The backside contact via 128 extends through the backside dielectric layer 130, the mesa feature 102M, the undoped epitaxial layer 104 to electrically coupled to the n-type source feature 106NS. A portion of the gate spacer 116 may be disposed along sidewalls of the undoped epitaxial layer 104. As shown in FIGS. 4 and 5, the mesa feature 102M under the n-type gate structure 110N and the mesa feature 102M under the p-type gate structure 110P are electrically insulated from one another at least by the isolation structure 103 and are no longer disposed on a common semiconductor substrate.

Figure 6:
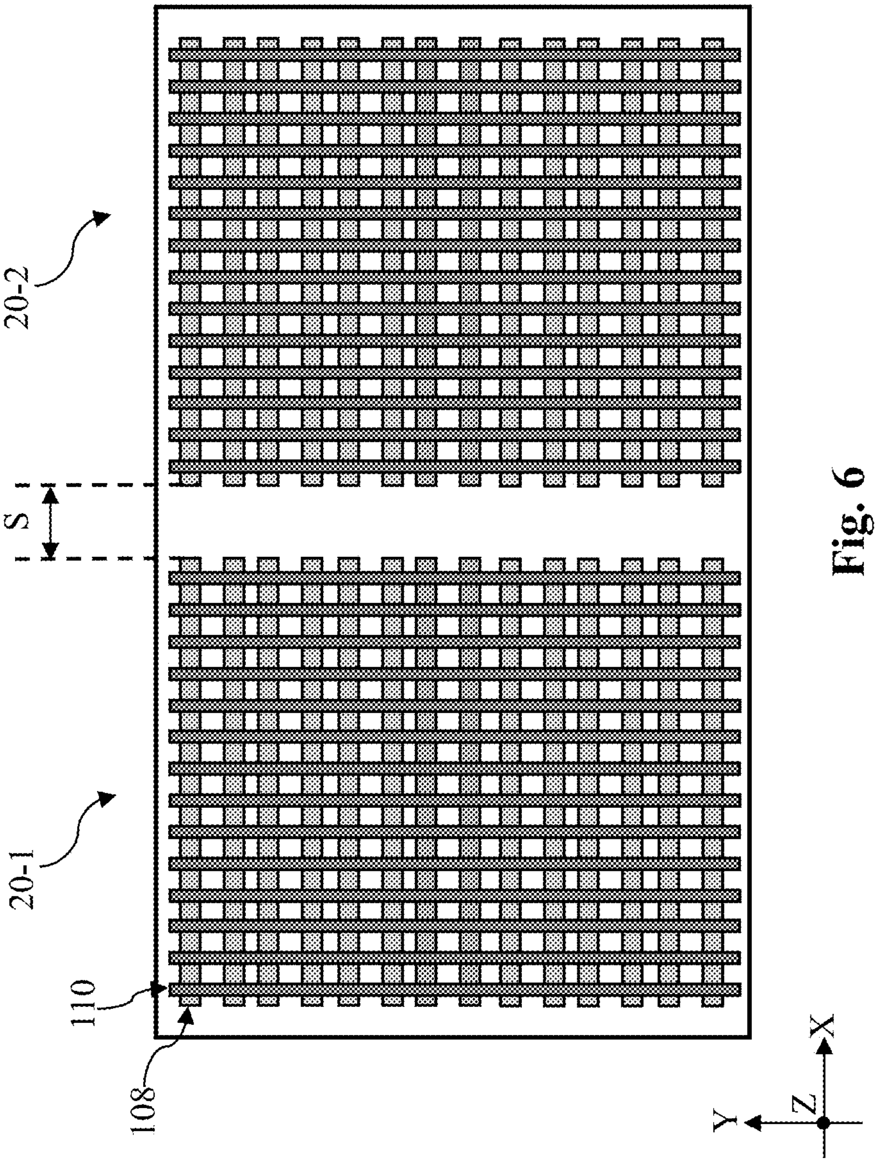
FIG. 6 illustrates a schematic top view of two eFuse bit cells and a spacing between them, according to various aspects of the present disclosure.

FIG. 6 illustrates a schematic top view of the first bit cell 20-1 and the second bit cell 20-2 and a spacing S between them. Because of adoption of the transistor structures shown in FIGS. 3-5, no tap cells or n-type wells exist between the first bit cell 20-1 and the second bit cell 20-2. Each of the first bit cell 20-1 and second bit cell 20-2 includes an array of transistors. As shown in FIG. 6, each of the first bit cell 20-1 and second bit cell 20-2 includes active regions 108 extending lengthwise along the X direction and gate structures 110 (including n-type gate structure 110N, p-type gate structure 110P, or both) extending lengthwise along the Y direction. In some embodiments represented in FIG. 6, the active regions 108 in the first bit cell 20-1, while aligned with the active regions 108 in the second bit cell 20-2 along the X direction, do not continue all the way to the second bit cell 20-2. Instead, the active regions 108 in the first bit cell 20-1 and the second bit cell 20-2 do not extend into the space S between the first bit cell 20-1 and the second bit cell 20-2. The space S includes the isolation structure 103 illustrated in FIGS. 3-5.

Figure 7:
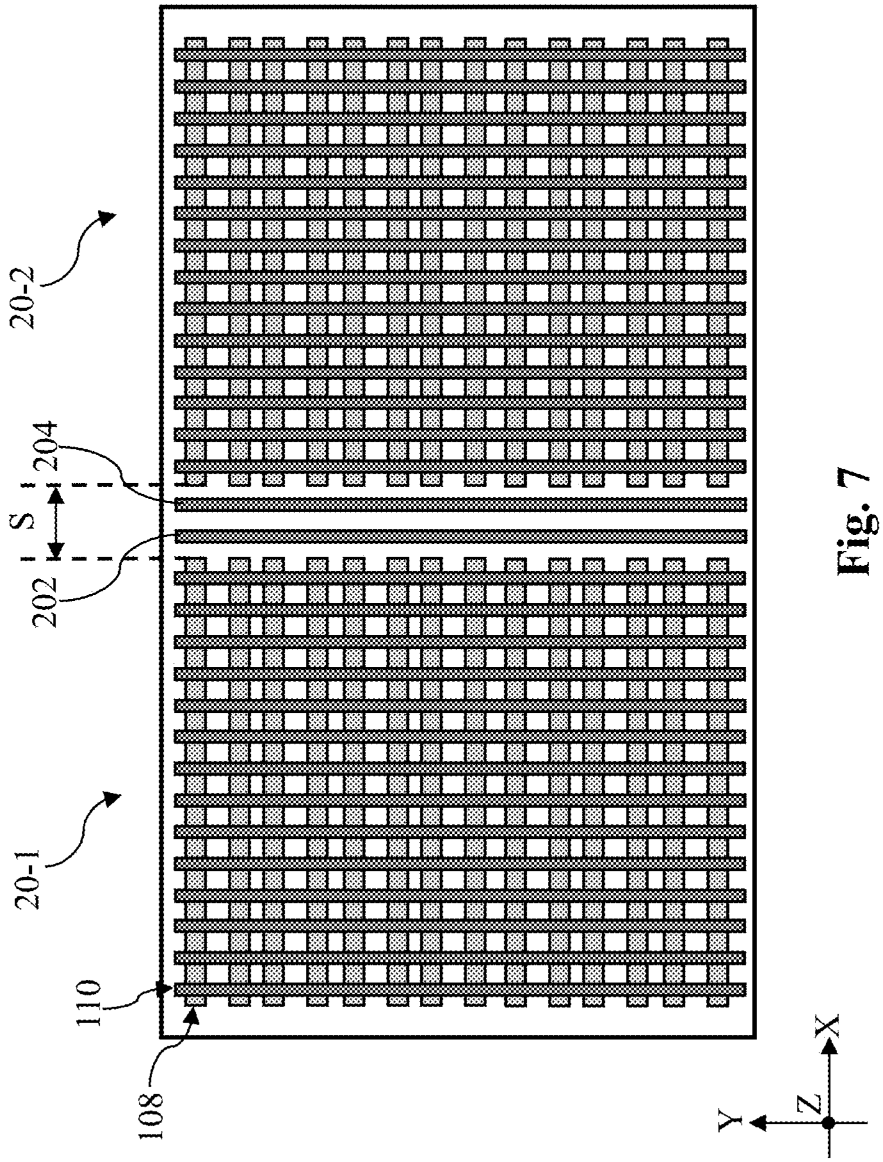
FIG. 7 illustrates a schematic top view of two eFuse bit cells and at least two isolation gate structures between them, according to various aspects of the present disclosure.

FIG. 7 illustrates a schematic top view of the first bit cell 20-1 and the second bit cell 20-2 and at least two isolation gate structures 202 and 204 between them. Because of adoption of the transistor structures shown in FIGS. 3-5, no tap cells or n-type wells exist between the first bit cell 20-1 and the second bit cell 20-2. Each of the first bit cell 20-1 and second bit cell 20-2 includes an array of transistors. As shown in FIG. 7, each of the first bit cell 20-1 and second bit cell 20-2 includes active regions 108 extending lengthwise along the X direction and gate structures 110 (including n-type gate structure 110N, p-type gate structure 110P, or both) extending lengthwise along the Y direction. In some embodiments represented in FIG. 7, the active regions 108 in the first bit cell 20-1, while aligned with the active regions 108 in the second bit cell 20-2 along the X direction, do not continue all the way to the second bit cell 20-2. Instead, the active regions 108 in the first bit cell 20-1 and the second bit cell 20-2 do not extend into the space S between the first bit cell 20-1 and the second bit cell 20-2. Different from the example embodiment shown in FIG. 6, the space S between the first bit cell 20-1 and the second bit cell 20-2 in FIG. 7 includes at least one isolation gate structure. In FIG. 7, a first isolation gate structure 202 and a second isolation gate structure 204 are disposed in the space S. Each of the first isolation gate structure 202 and the second isolation gate structure 204 include conductive metals and may share similar compositions with the rest of the gate structures 110. The first isolation gate structure 202 and the second isolation gate structure 204 do not engage any channel members 1080 or active regions 108 and are dummy gate structures functioning to reduce etch loading effect and to separate the first bit cell 20-1 and the second bit cell 20-2.

Figure 8:
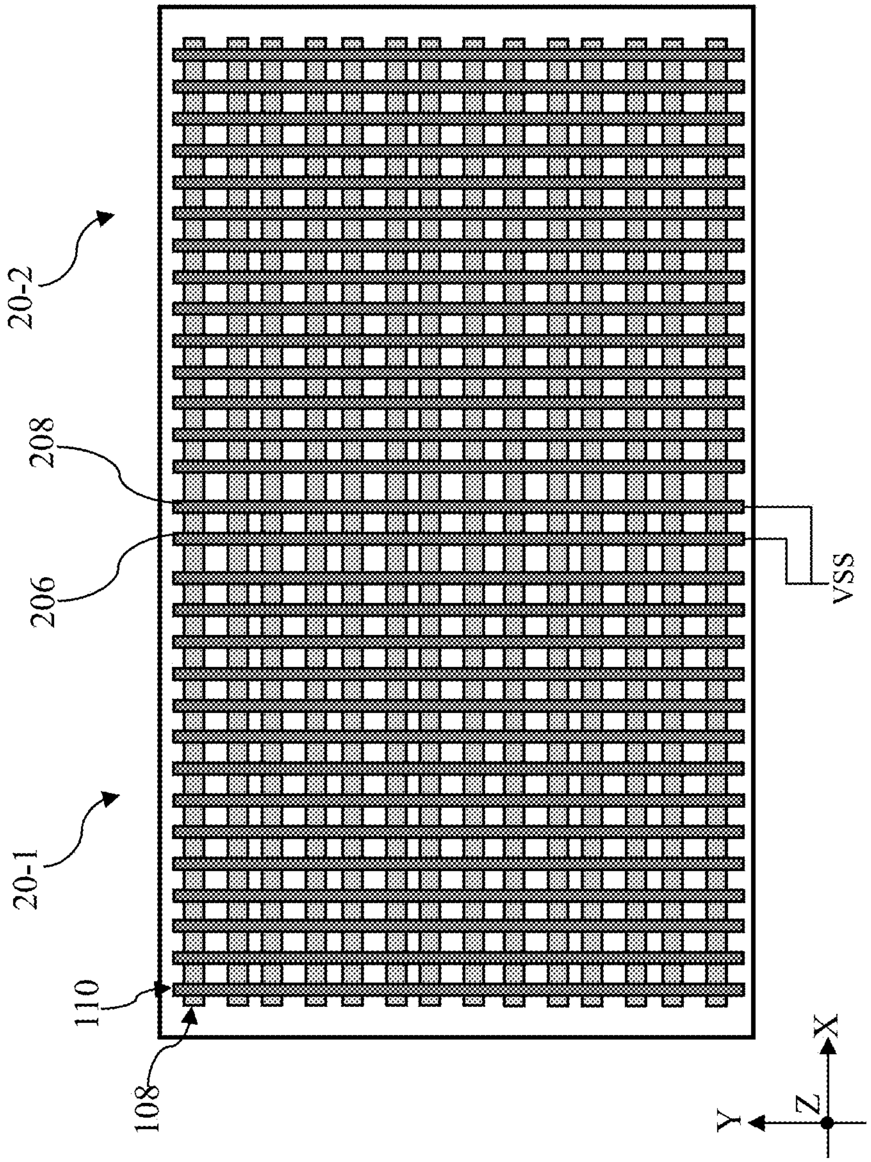
FIG. 8 illustrates a schematic top view of two eFuse bit cells and grounded gate structures between them, according to various aspects of the present disclosure.

FIG. 8 illustrates a schematic top view of the first bit cell 20-1 and the second bit cell 20-2 and first and second grounded gate structures 206 and 208. Because of adoption of the transistor structures shown in FIGS. 3-5, no tap cells or n-type wells exist between the first bit cell 20-1 and the second bit cell 20-2. Each of the first bit cell 20-1 and second bit cell 20-2 includes an array of transistors. As shown in FIG. 8, each of the first bit cell 20-1 and second bit cell 20-2 includes active regions 108 extending lengthwise along the X direction and gate structures 110 (including n-type gate structure 110N, p-type gate structure 110P, or both) extending lengthwise along the Y direction. In some embodiments represented in FIG. 8, the active regions 108 in the first bit cell 20-1 are aligned with and continuous with the active regions 108 in the second bit cell 20-2 along the X direction. That is, the active regions 108 are continuous structures extending across the first bit cell 20-1 and the second bit cell 20-2 along the X direction. Different from the example embodiments shown in FIGS. 6 and 7, at least one grounded gate structure is disposed between the first bit cell 20-1 and the second bit cell 20-2. In some embodiments represented in FIG. 8, a first grounded gate structure 206 and a second grounded gate structure 208 are disposed between the first bit cell 20-1 and the second bit cell 20-2. While the first grounded gate structure 206 and the second grounded gate structure 208 share similar compositions with the rest of the gate structures 110, they are electrically coupled to the circuit ground VSS. By coupling the first grounded gate structure 206 and the second grounded gate structure 208 to the circuit ground VSS, all transistors controlled by the first grounded gate structure 206 and the second grounded gate structure 208 are turned off to become turned-off transistors. An example turned-off transistor is described below in conjunction with FIG. 9.

Figure 9:
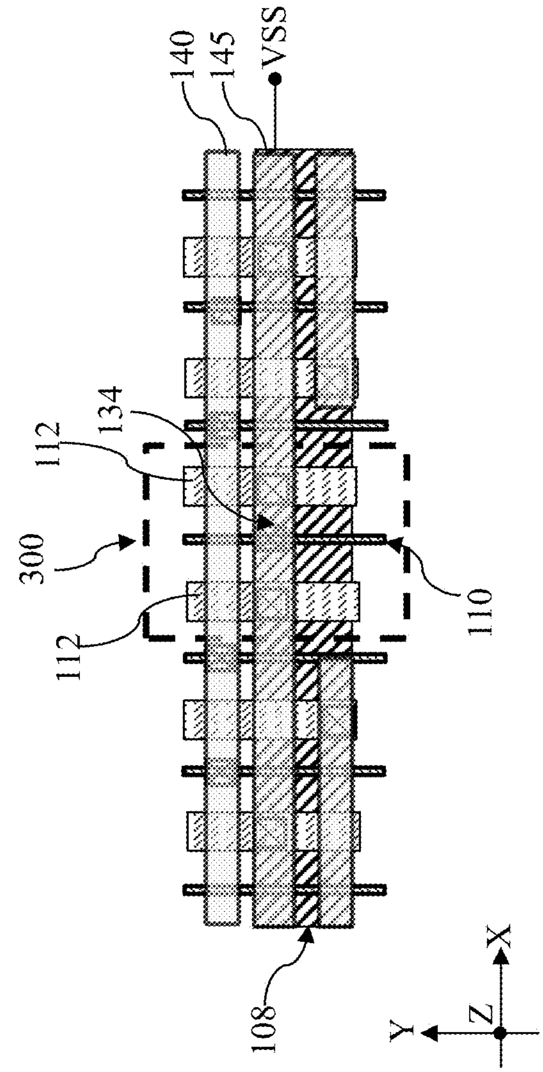
FIG. 9 illustrates a schematic top view of a turned-off transistor, according to various aspects of the present disclosure.

FIG. 9 illustrates a schematic top view of a turned-off transistor 300. The turned-off transistor 300 includes a gate structure 110 (which may be an n-type gate structure 110N or a p-type gate structure 110P) disposed over an active region 108. The gate structure 110 of the turned-off transistor 300 is disposed between two source/drain contacts 112 (which may be n-type source contacts 112NS, n-type drain contacts 112ND, p-type source contacts 112PS, or p-type drain contacts 112PD). As shown in FIG. 9, instead of being coupled to the word line 140, the gate structure 110 of the turned-off transistor 300 is electrically coupled to a metal line 145 by way of a contact via 134. that is coupled to the circuit ground (VSS). Through electrical connections not explicitly shown, the metal line 145 is electrically coupled to the circuit ground (VSS). As a result, the gate structure 110 of the turned-off transistor 300 is pulled to the circuit ground (VSS) is turned off.

Figure 10:
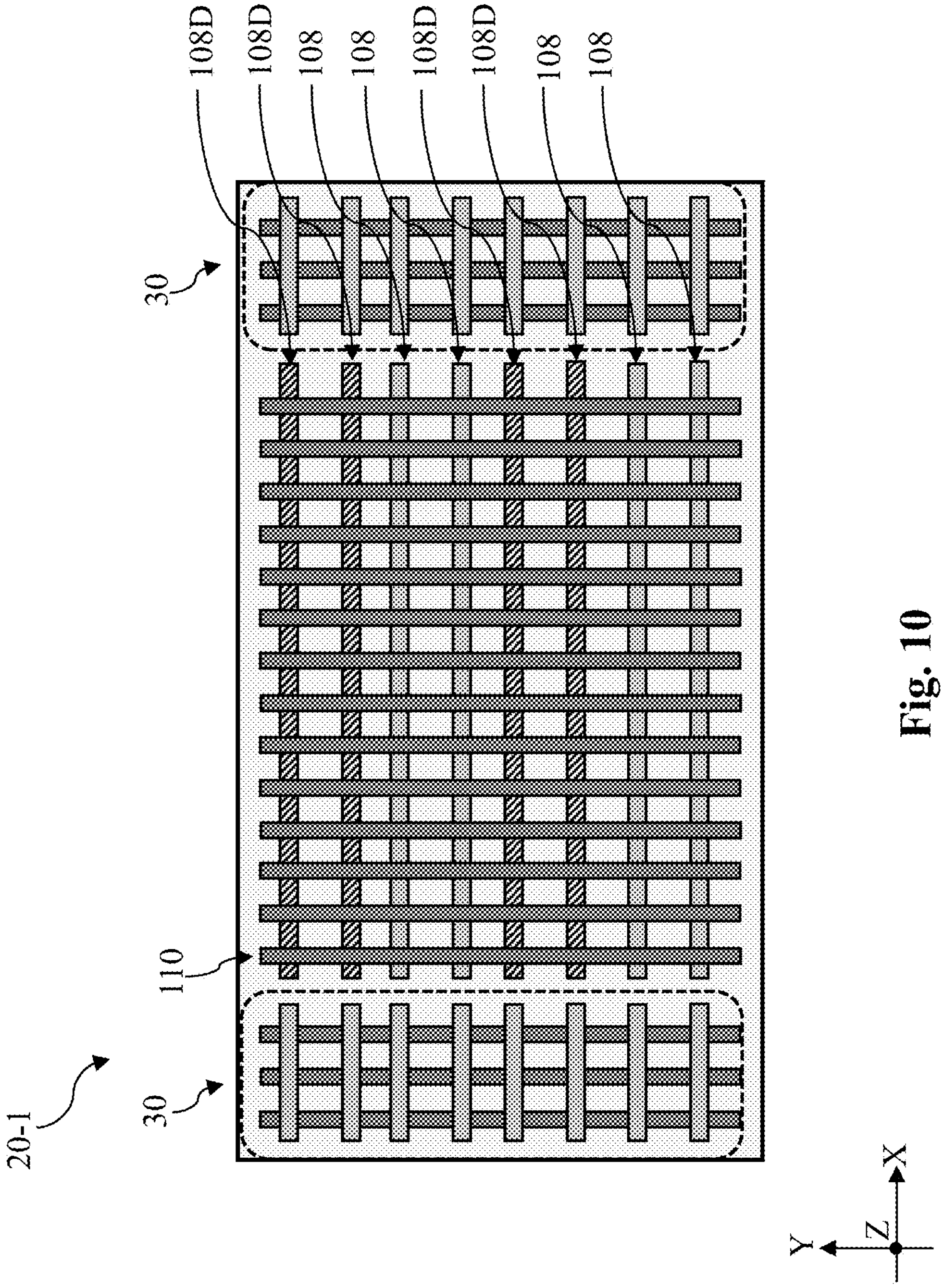
FIG. 10 illustrates a schematic top view of an eFuse bit cell having dummy tap cells and dummy active regions, according to various aspects of the present disclosure.

FIG. 10 illustrates a schematic top view of a first bit cell 20-1 having dummy tap cells 30 and dummy active regions 108D. Because of adoption of the transistor structures shown in FIGS. 3-5, no tap cells or n-type wells are needed between or around the first bit cell 20-1 and the second bit cell 20-2 in order for the first bit cell 20-1 to function properly. In some embodiments, dummy tap cells 30 are inserted to increase the X-direction dimensions of the first bit cell 20-1 to create room for metal wire routing. In the embodiments represented in FIG. 10, two dummy tap cells 30 are inserted on both sides of a functional block. The dummy tap cells 30 are described as "dummy" because they are no longer disposed on a bulk substrate that is physically connected to the active regions 108 in the functional block in the middle. In addition, dummy active regions 108D are inserted between active regions 108 to increase the Y-direction dimensions of the first bit cell 20-1. In the depicted embodiments, both the active regions 108 and the dummy active regions 108D come in pairs and the pairs of active regions 108 and the pairs of dummy active regions 108D are interleaved with one another. Dummy active regions 108D and active regions 108 are the same in terms of dimensions and composition. The difference lies primarily in electrically connections. For purpose of the present disclosure, a dummy active region 108D refers to an active region where all of the source/drain features (or source/drain contacts) are electrically floating. As used herein, being electrically floating means that the source/drain features (or source/drain contacts) are not electrically coupled to the backside interconnect structure 1000 or the frontside interconnect structure 2000.

Figure 11:
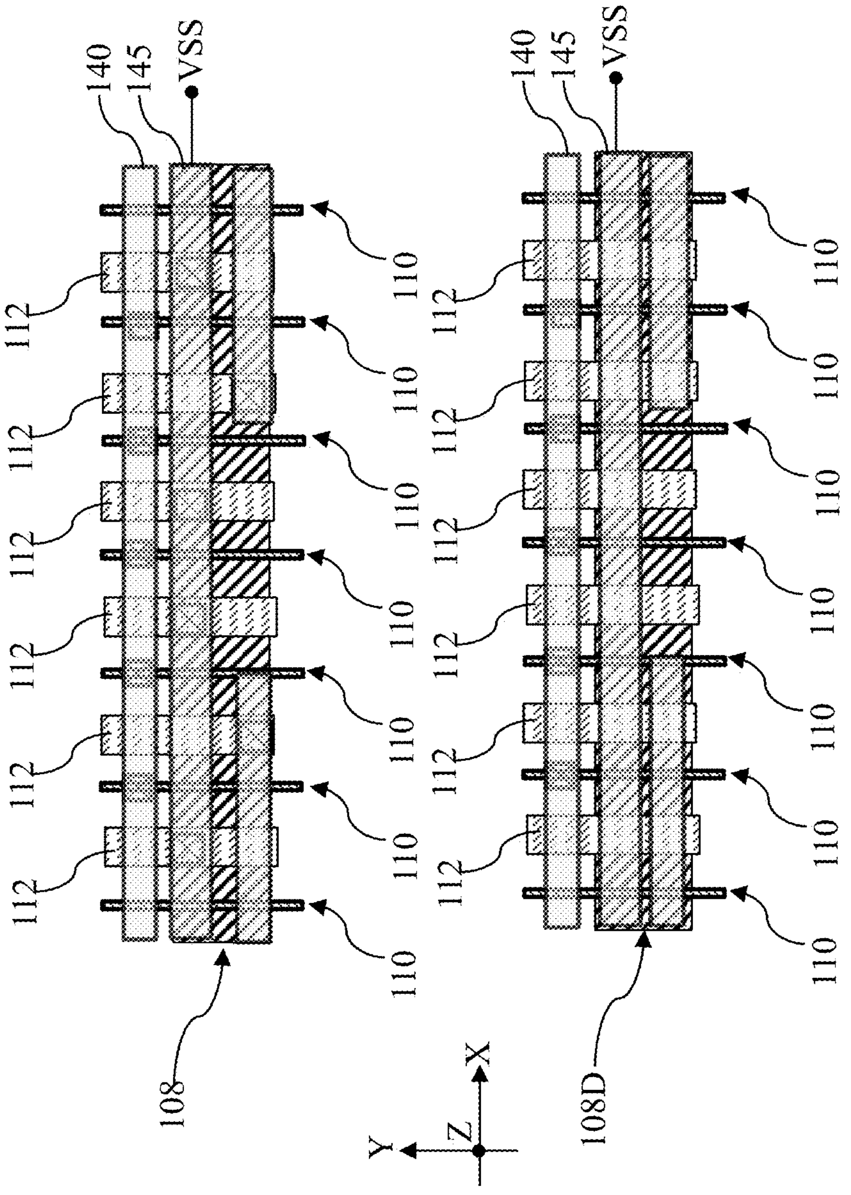
FIG. 11 illustrates schematic top views of an active region and a dummy active region, according to various aspects of the present disclosure.

FIG. 11 illustrates schematic top views of an active region 108 and a dummy active region 108D. The side-by-side comparison of the active region 108 and the dummy active region 108D is helpful in understanding their differences. As shown in FIG. 11, each of the active region 108 and the dummy active region 108D extends lengthwise along the X direction. Each of the active region 108 and the dummy active region 108D is intersected by a plurality of source/drain contacts 112 (which may be n-type source contacts 112NS, n-type drain contacts 112ND, p-type source contacts 112PS, or p-type drain contacts 112PD). At least some of the source/drain contacts 112 over the active region 108 are electrically coupled to the metal line 145 but none of the source/drain contacts 112 over the dummy active region 108D are coupled to any of the metal lines extending over the source/drain contacts 112.

Figure 12:
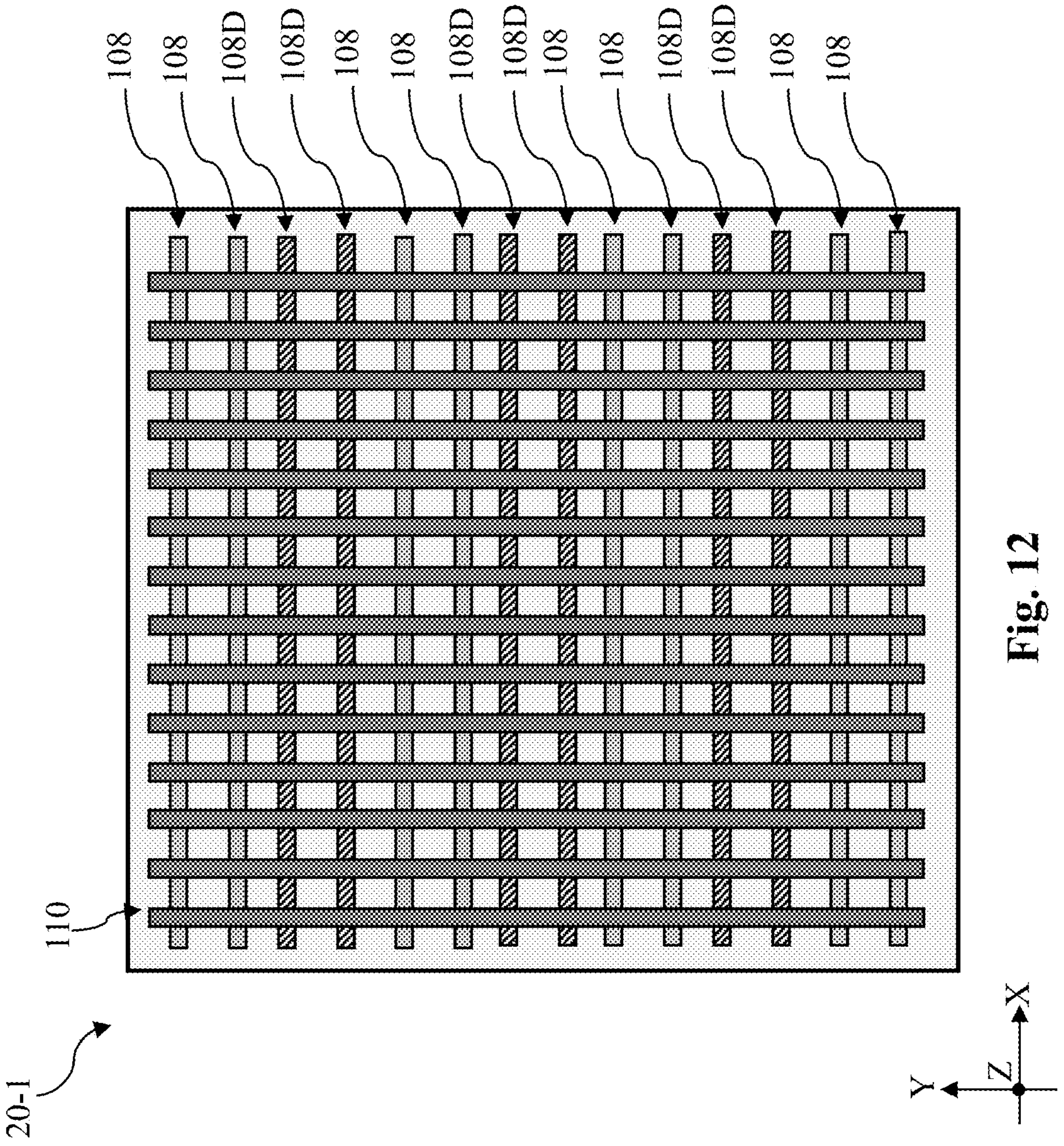
FIG. 12 illustrates a schematic top view of an eFuse bit cell having dummy active regions, according to various aspects of the present disclosure.

FIG. 12 illustrates a schematic top view of a first bit cell 20-1 having dummy active regions 108D. In FIG. 12, dummy active regions 108D are inserted between active regions 108 of the first bit cell 20-1 to increase the Y-direction dimensions of the first bit cell 20-1. In the depicted embodiments, both the active regions 108 and the dummy active regions 108D come in pairs and the pairs of active regions 108 and the pairs of dummy active regions 108D are interleaved with one another. As described above, dummy active regions 108D and active regions 108 are the same in terms of dimensions and composition. The difference lies primarily in electrical connections.

Figure 13:
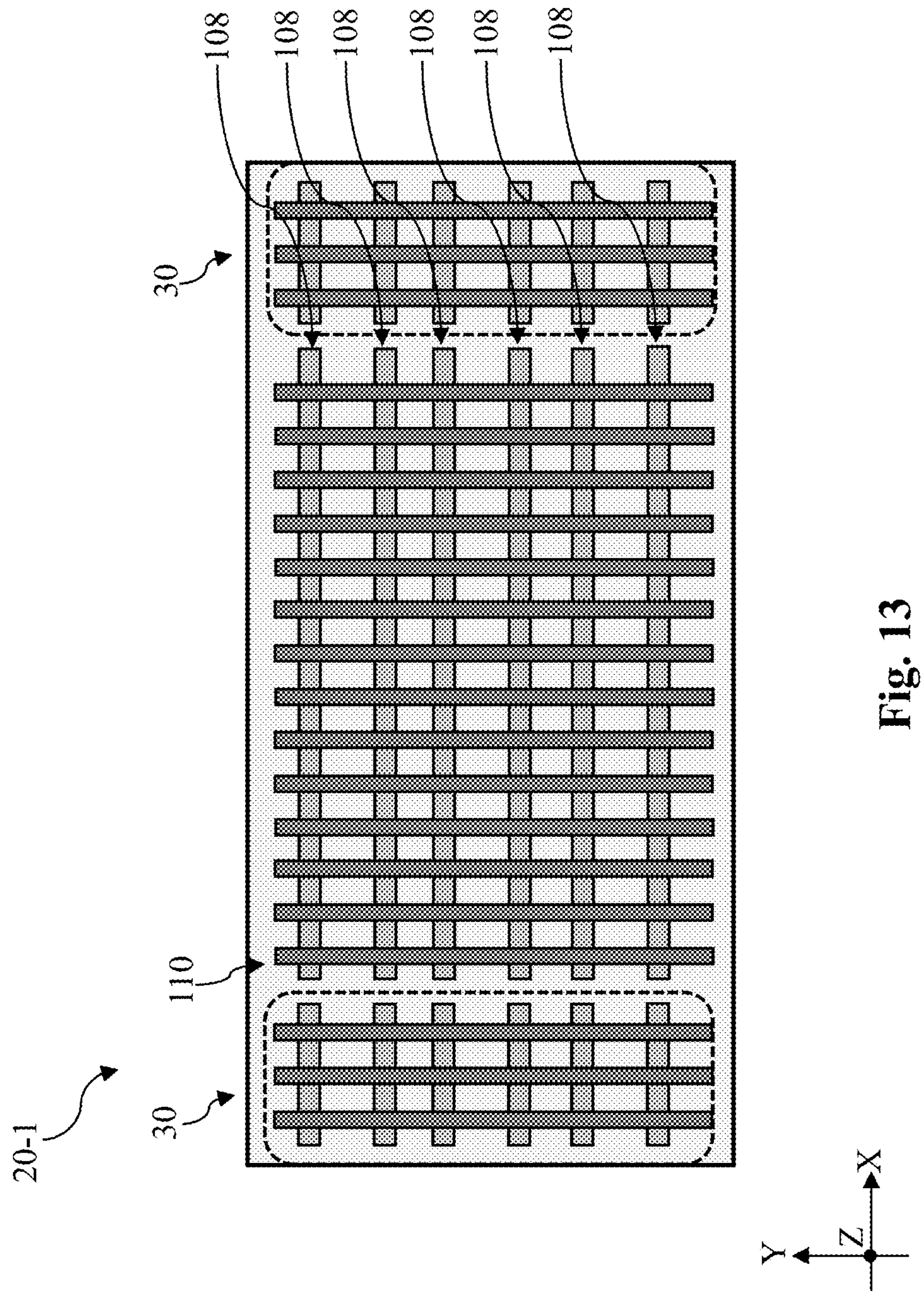
FIG. 13 illustrates a schematic top view of an eFuse bit cell having dummy tap cells, according to various aspects of the present disclosure.

FIG. 13 illustrates a schematic top view of a first bit cell 20-1 having dummy tap cells 30. The first bit cell 20-1 in FIG. 13 is similar to the one shown in FIG. 10 except that no dummy active regions 108D are inserted among the active regions 108 to increase the Y-direction dimensions of the first bit cell 20-1. The first bit cell 20-1 in FIG. 13 includes two dummy tap cells 30 to increase the X-direction dimensions of the first bit cell 20-1 to accommodate metal wire routing in either in the backside interconnect structure 1000 or in the frontside interconnect structure 2000.

Figure 14:
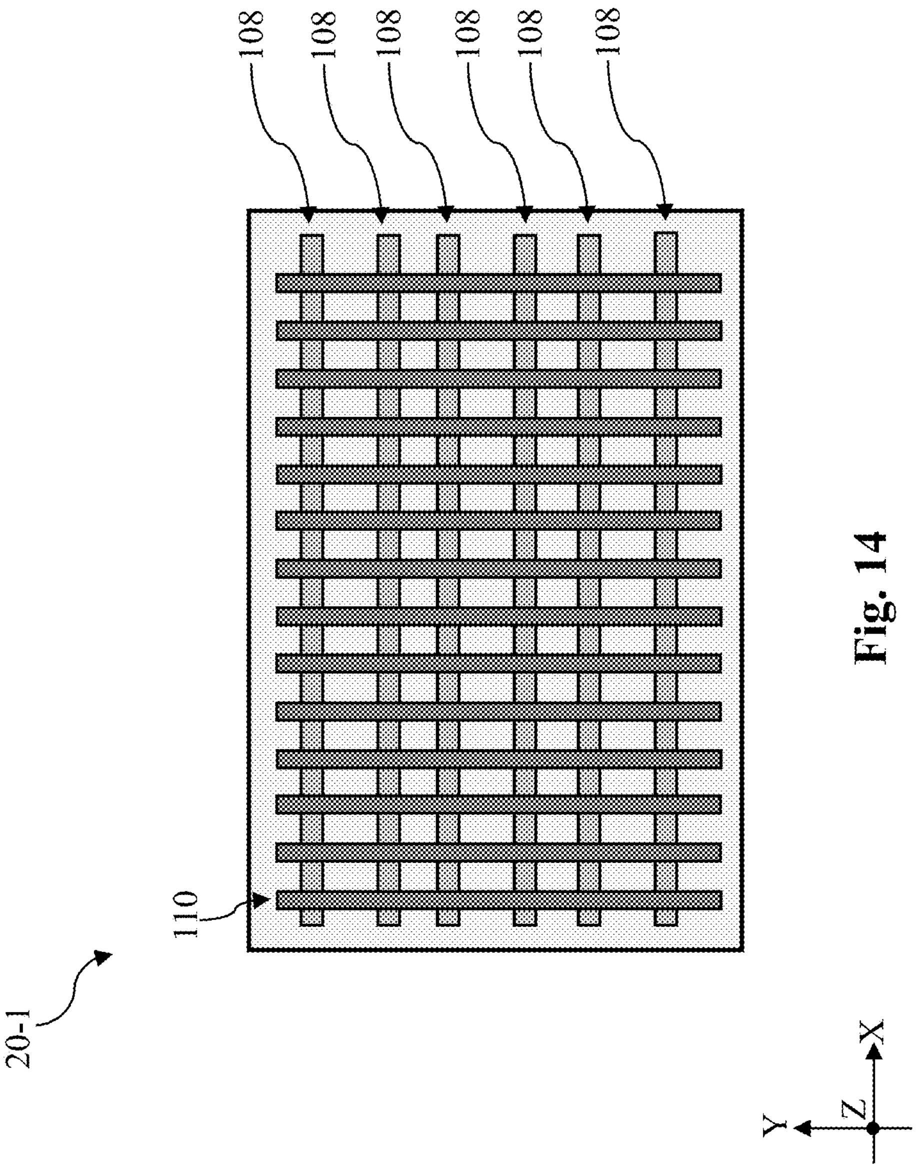
FIG. 14 illustrates a schematic top view of an eFuse bit cell without any dummy tap cells and dummy active regions, according to various aspects of the present disclosure.

FIG. 14 illustrates a schematic top view of a first bit cell 20-1 without any dummy tap cells 30 and dummy active regions 108D. The first bit cell 20-1 in FIG. 14 is similar to the one shown in FIG. 13 except that the first bit cell 20-1 in FIG. 14 do not have the two dummy tap cells 30.

Figure 15:
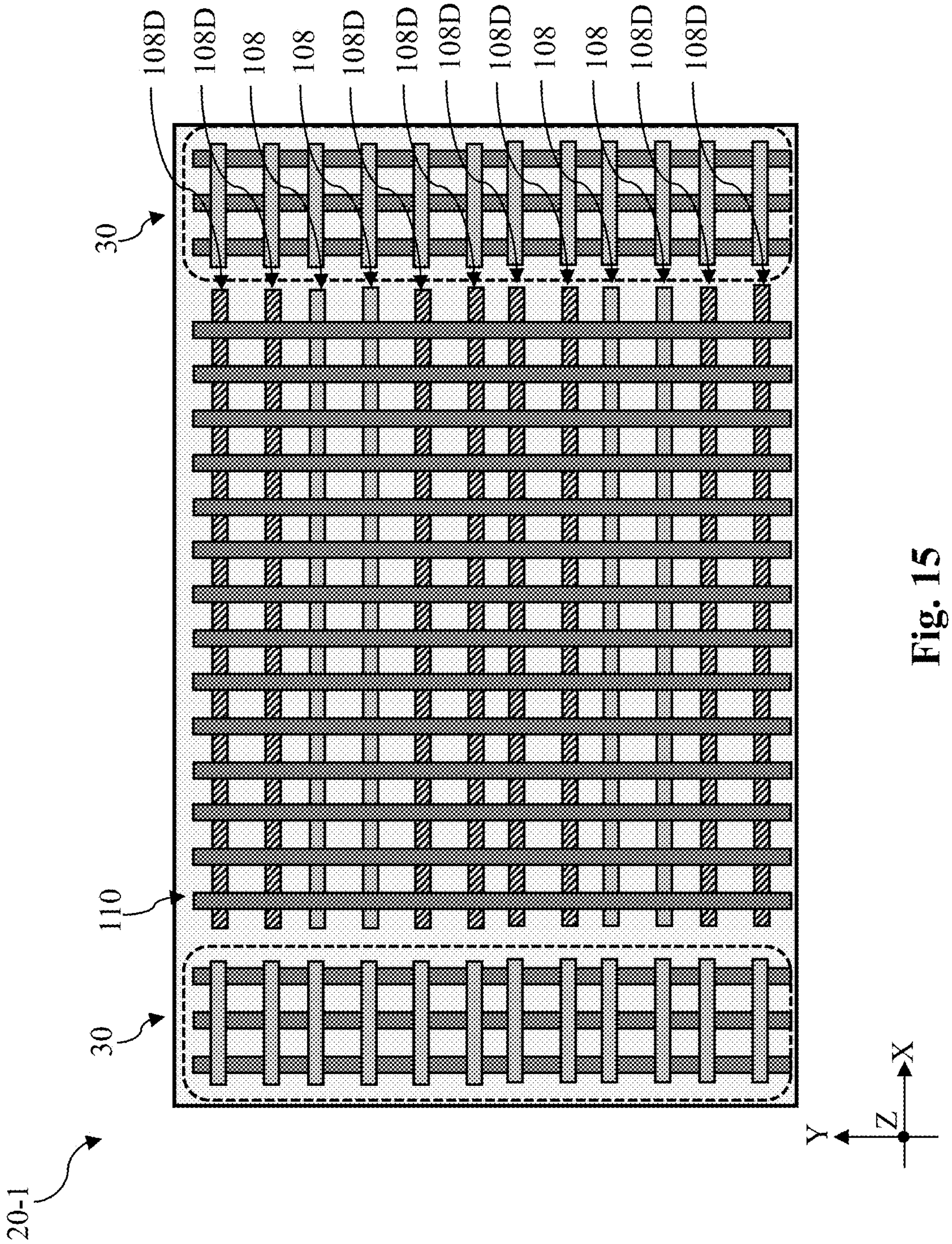
FIG. 15 illustrates a schematic top view of an eFuse bit cell having dummy tap cells and dummy active regions, according to various aspects of the present disclosure.

FIG. 15 illustrates a schematic top view of a first bit cell 20-1 having dummy tap cells 30 and dummy active regions 108D. The first bit cell 20-1 in FIG. 15 is similar to the one shown in FIG. 10 except that the dummy active regions 108D in the first bit cell 20-1 in FIG. 15 are inserted as groups of four. The arrangement increases the Y-direction dimensions of the first bit cell 20-1 to accommodate metal features in the third metal layer M2 in the frontside interconnect structure 2000.

Figure 16:
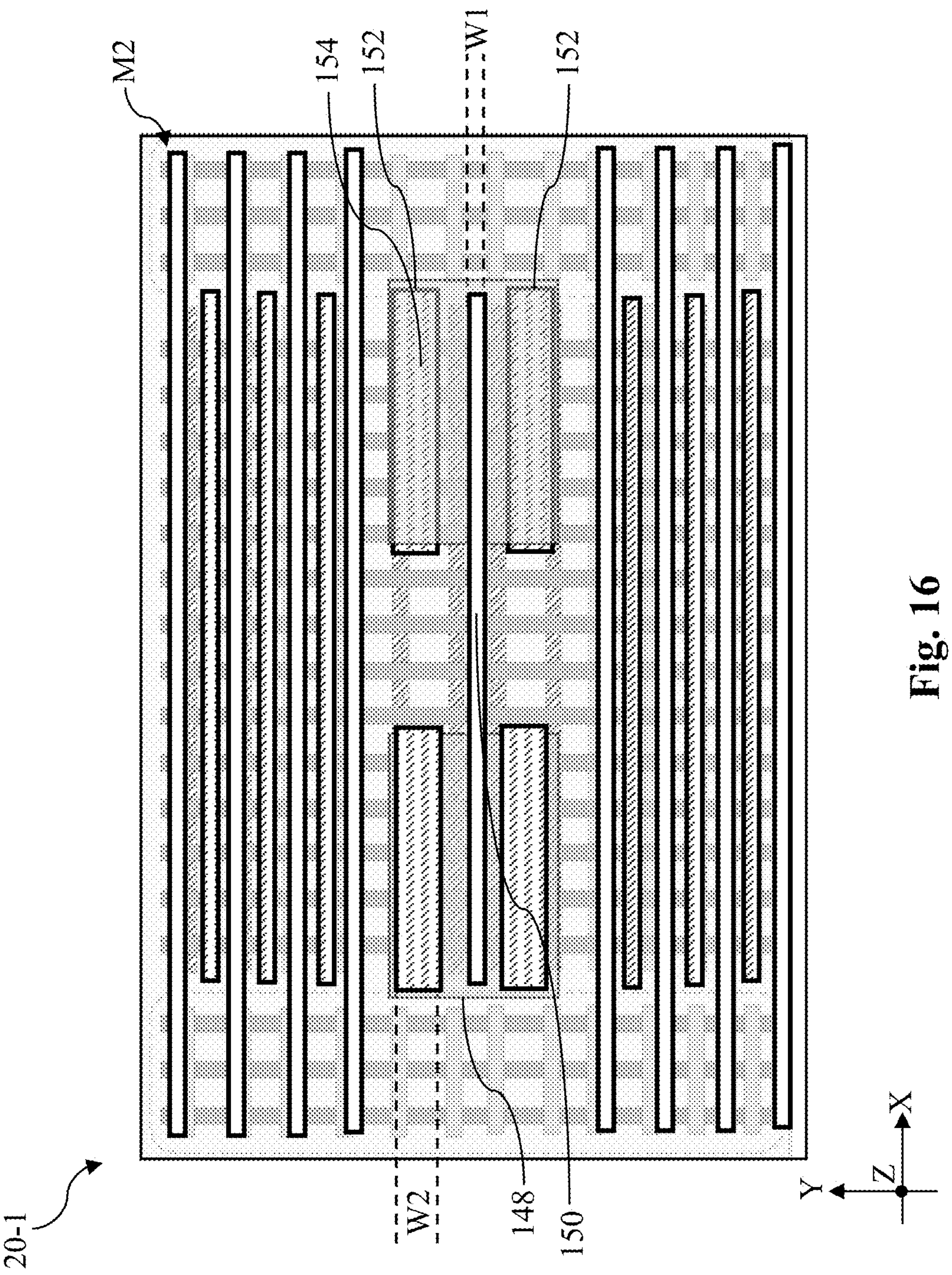
FIG. 16 illustrates a schematic top view of metal lines in a third metal layer over the eFuse bit cell in FIG. 15, according to various aspects of the present disclosure.

Reference is now made to FIG. 16, a see-through view of metal features in the third metal layer M2 is overlaid onto the first bit cell 20-1. To ensure that the fuse link 150 blows open in a controlled manner, each of the two ends of the fuse link 150 is disposed between two fuse wings 152. The fuse wings 152 may be electrically coupled to the fuse link 150 by way of a first metal feature 148 in the second metal layer M1 or a second metal feature 154 in the fourth metal layer M3. This arrangement reduces the resistance of the programming current path, which increases the programming current available to blow the middle section of the fuse link 150. In the depicted embodiments, the fuse link 150 has a first width (W1) and the fuse wing 152 has a second width (W2). In some embodiments, a ratio of the second width (W2) to the first width (W1) may be between 0.5 and 5.

Figure 17:
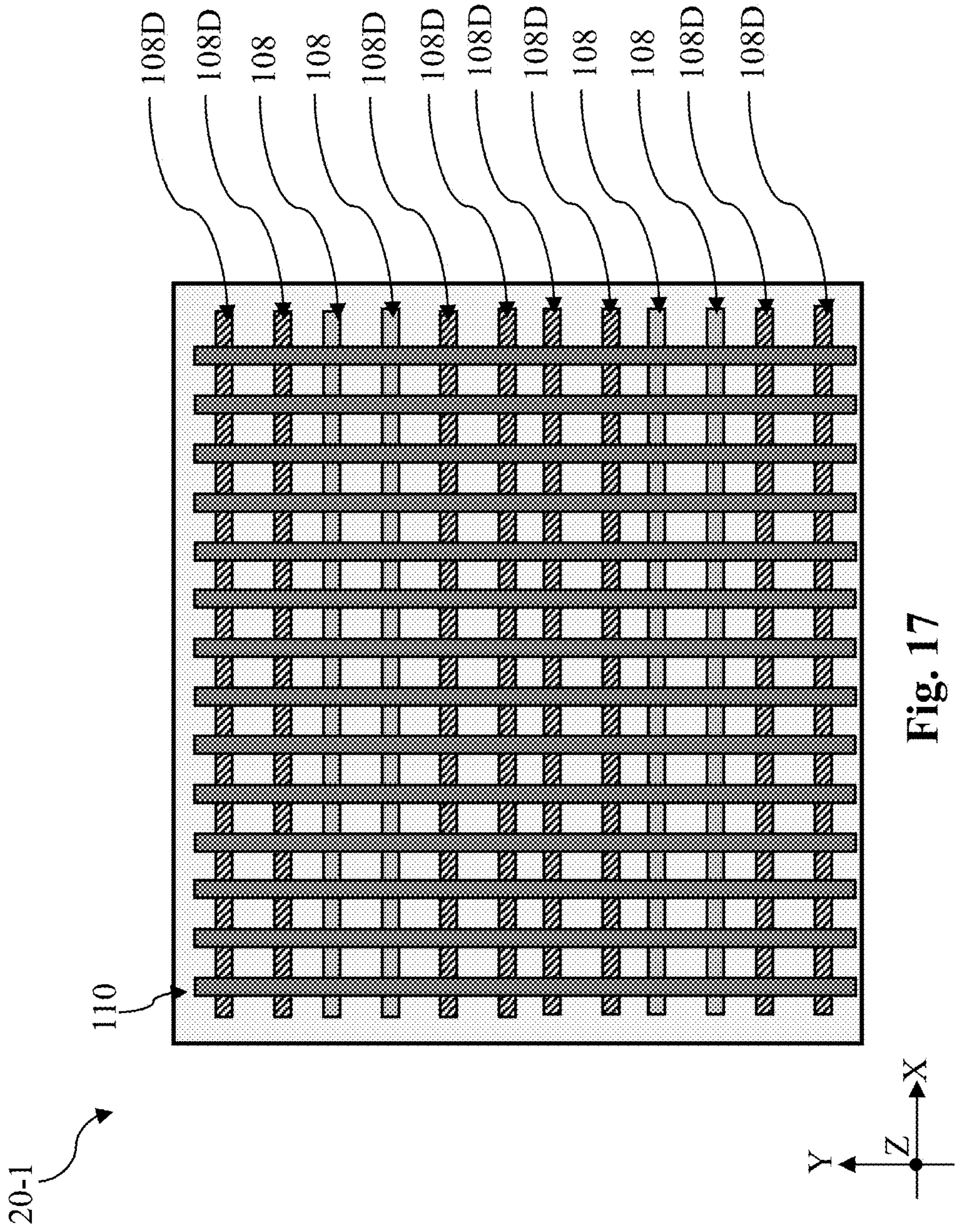
FIG. 17 illustrates a schematic top view of an eFuse bit cell without any dummy tap cells and dummy active regions, according to various aspects of the present disclosure.

FIG. 17 illustrates a schematic top view of a first bit cell 20-1 without any dummy tap cells 30 and dummy active regions 108D. The first bit cell 20-1 in FIG. 17 is similar to the one shown in FIG. 16 except that the first bit cell 20-1 in FIG. 17 do not include any dummy tap cells 30.

It should be understood that while the space saving due to the adoption of the transistor structures shown in FIGS. 3-5 is described with respect to the first bit cell 20-1 in FIGS. 6-8, 10, and 12-17, similar space saving may apply to other bit cells (e.g., the second bit cell 20-2, the third bit cell 20-3, and the fourth bit cell 20-4), the first sense amplifier cell 40-1, the second sense amplifier cell 40-2, and the power switch 60.

In one example aspect, the present disclosure provides an electronic fuse device in accordance with some embodiments. The electronic fuse device includes a first bit cell including a first plurality of active regions extending along a first direction and a second bit cell including a second plurality of active regions extending along the first direction. Each of the first plurality of active regions is aligned with one of the second plurality of active regions along the first direction. The first bit cell and the second bit cell are spaced apart along the first direction by a space and the space is free of a well tap cell.

In some embodiments, the first plurality of active regions are discontinuous with the second plurality of active regions. In some implementations, the electronic fuse device further includes at least one isolation gate structure disposed between the first bit cell and the second bit cell. In some instances, the at least one isolation gate structure includes a gate dielectric layer and a gate electrode over the gate dielectric layer and the gate electrode includes metal. In some embodiments, the electronic fuse device further includes at least one grounded gate structure disposed between the first bit cell and the second bit cell and the at least one grounded gate structure is electrically coupled to a circuit ground. In some embodiments, the electronic fuse device further includes a backside interconnect structure below the first bit cell and the second bit cell, and a frontside interconnect structure over the first bit cell and the second bit cell. In some embodiments, the electronic fuse device further includes a plurality of dummy active regions extending along the first direction and interleave the plurality of active region and a plurality of source/drain contacts disposed over the plurality of dummy active regions. The plurality of source/drain contacts are not electrically coupled to the frontside interconnect structure or the backside interconnect structure. In some embodiments, the frontside interconnect structure includes a fuse link. The fuse link includes two end portions and each of the end portions is disposed between two fuse wings.

Another aspect of the present disclosure pertains to an electronic fuse device in accordance with some embodiments. The electronic fuse device includes a first bit cell having a first n-type transistor and a first p-type transistor, and a second bit cell having a second n-type transistor and a second p-type transistor. The first n-type transistor is disposed over a first p-type well, the first p-type transistor is disposed over a first n-type well, the first p-type well is insulated from the first n-type well, the second n-type transistor is disposed over a second p-type well, the second p-type transistor is disposed over a second n-type well, and the second p-type well is insulated from the second n-type well.

In some embodiments, the first n-type transistor includes a source feature and a drain feature, a plurality of channel members extending between the source feature and the drain feature, and a gate structure wrapping around each of the plurality of channel members. In some implementations, the electronic fuse device further includes a backside interconnect structure below the first bit cell and the second bit cell, a frontside interconnect structure over the first bit cell and the second bit cell, and a backside contact via extending between a bottom surface of the source feature and the backside interconnect structure. In some embodiments, the first bit cell and the second bit cell are spaced apart by a space and the space is free of a well tap cell. In some embodiments, the electronic fuse device further includes at least one isolation gate structure disposed between the first bit cell and the second bit cell. In some instances, the at least one isolation gate structure includes a gate dielectric layer and a gate electrode. In some embodiments, the electronic fuse device further includes at least one grounded gate structure disposed between the first bit cell and the second bit cell. The at least one grounded gate structure is electrically coupled to a circuit ground. In some embodiments, the electronic device includes a sense amplifier cell, and a power switch cell.

Yet another aspect of the present disclosure pertains to an electronic fuse device in accordance with some embodiments. The electronic fuse device includes a first bit cell having a first complementary metal oxide semiconductor (CMOS) device and a second bit cell having a second CMOS device. The first CMOS device includes a first n-type transistor over a first p-type well, and a first p-type transistor over a first n-type well. The first p-type well is insulated from the first n-type well by an isolation structure. The first bit cell and the second bit cell are spaced apart by a space. The space is free of a well tap cell.

In some embodiments, the first n-type transistor includes a source feature and a drain feature, a plurality of channel members extending between the source feature and the drain feature, and a gate structure wrapping around each of the plurality of channel members. In some implementations, the electronic fuse device further includes a backside interconnect structure below the first bit cell and the second bit cell, a frontside interconnect structure over the first bit cell and the second bit cell, and a backside contact via extending between a bottom surface of the source feature and the backside interconnect structure. In some instances, each of the first bit cell and the second bit cell includes a rectangular shape.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An electronic fuse device, comprising:

a first bit cell comprising a first plurality of active regions extending along a first direction;

a second bit cell comprising a second plurality of active regions extending along the first direction;

a backside interconnect structure below the first bit cell and the second bit cell; and a frontside interconnect structure over the first bit cell and the second bit cell, wherein each of the first plurality of active regions is aligned with one of the second plurality of active regions along the first direction, wherein the first bit cell and the second bit cell are spaced apart along the first direction by a space, wherein the space is free of a well tap cell.

2. The electronic fuse device of claim 1, wherein the first plurality of active regions are discontinuous with the second plurality of active regions.

3. The electronic fuse device of claim 1, further comprising:

at least one isolation gate structure disposed between the first bit cell and the second bit cell.

4. The electronic fuse device of claim 3, wherein the at least one isolation gate structure comprises a gate dielectric layer and a gate electrode over the gate dielectric layer, wherein the gate electrode comprises metal.

5. The electronic fuse device of claim 1, further comprising:

at least one grounded gate structure disposed between the first bit cell and the second bit cell, wherein the at least one grounded gate structure is electrically coupled to a circuit ground.

6. The electronic fuse device of claim 1, further comprising:

a plurality of dummy active regions extending along the first direction and interleave the plurality of active region, a plurality of source/drain contacts disposed over the plurality of dummy active regions, wherein the plurality of source/drain contacts are not electrically coupled to the frontside interconnect structure or the backside interconnect structure.

7. The electronic fuse device of claim 1, wherein the frontside interconnect structure comprises a fuse link, wherein the fuse link comprises two end portions, wherein each of the end portions is disposed between two fuse wings.

8. The electronic fuse device of claim 1, wherein each of the first plurality of active regions comprises a mesa feature and channel members disposed over the mesa feature.

9. An electronic fuse device, comprising:

a first bit cell comprising a first n-type transistor and a first p-type transistor; and a second bit cell comprising a second n-type transistor and a second p-type transistor, wherein the first n-type transistor is disposed over a first p-type well, wherein the first p-type transistor is disposed over a first n-type well, wherein the first p-type well is insulated from the first n-type well, wherein the second n-type transistor is disposed over a second p-type well, wherein the second p-type transistor is disposed over a second n-type well, wherein the second p-type well is insulated from the second n-type well.

10. The electronic fuse device of claim 9, wherein the first n-type transistor comprises:

a source feature and a drain feature;

a plurality of channel members extending between the source feature and the drain feature; and a gate structure wrapping around each of the plurality of channel members.

11. The electronic fuse device of claim 10, further comprising:

a backside interconnect structure below the first bit cell and the second bit cell;

a frontside interconnect structure over the first bit cell and the second bit cell; and a backside contact via extending between a bottom surface of the source feature and the backside interconnect structure.

12. The electronic fuse device of claim 9, wherein the first bit cell and the second bit cell are spaced apart by a space, wherein the space is free of a well tap cell.

13. The electronic fuse device of claim 9, further comprising:

at least one isolation gate structure disposed between the first bit cell and the second bit cell.

14. The electronic fuse device of claim 9, wherein the at least one isolation gate structure comprises a gate dielectric layer and a gate electrode.

15. The electronic fuse device of claim 9, further comprising:

at least one grounded gate structure disposed between the first bit cell and the second bit cell, wherein the at least one grounded gate structure is electrically coupled to a circuit ground.

16. The electronic fuse device of claim 9, further comprising:

a sense amplifier cell; and a power switch cell.

17. An electronic fuse device, comprising:

a first bit cell comprising a first complementary metal oxide semiconductor (CMOS) device; and a second bit cell comprising a second CMOS device, wherein the first CMOS device comprises:

a first n-type transistor over a first p-type well, a first p-type transistor over a first n-type well, wherein the first p-type well is insulated from the first n-type well by an isolation structure, wherein the first bit cell and the second bit cell are spaced apart by a space, wherein the space is free of a well tap cell.

18. The electronic fuse device of claim 17, wherein the first n-type transistor comprises:

a source feature and a drain feature;

a plurality of channel members extending between the source feature and the drain feature; and a gate structure wrapping around each of the plurality of channel members.

19. The electronic fuse device of claim 18, further comprising:

a backside interconnect structure below the first bit cell and the second bit cell;

a frontside interconnect structure over the first bit cell and the second bit cell; and a backside contact via extending between a bottom surface of the source feature and the backside interconnect structure.

20. The electronic fuse device of claim 17, wherein each of the first bit cell and the second bit cell comprises a rectangular shape.

* * * * *